United States Patent
Lee et al.

(10) Patent No.: US 10,069,475 B2
(45) Date of Patent: Sep. 4, 2018

(54) BULK-ACOUSTIC WAVE FILTER DEVICE

(71) Applicant: Samsung Electro-Mechanics Co., Ltd., Suwon-si (KR)

(72) Inventors: Tae Kyung Lee, Suwon-si (KR); Yong Jin Kang, Suwon-si (KR); Moon Chul Lee, Suwon-si (KR); Jae Hyoung Gil, Suwon-si (KR); Chang Hyun Lim, Suwon-si (KR); Tae Yoon Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 26 days.

(21) Appl. No.: 15/462,110

(22) Filed: Mar. 17, 2017

(65) Prior Publication Data

US 2018/0062620 A1   Mar. 1, 2018

(30) Foreign Application Priority Data

Aug. 26, 2016 (KR) .......................... 10-2016-0108974

(51) Int. Cl.
| | | |
|---|---|---|
| H03H 9/54 | (2006.01) | |
| H01L 41/08 | (2006.01) | |
| H03H 3/02 | (2006.01) | |
| H03H 9/60 | (2006.01) | |
| H01L 41/047 | (2006.01) | |

(52) U.S. Cl.
CPC ........... *H03H 9/60* (2013.01); *H01L 41/0477* (2013.01); *H03H 3/02* (2013.01); *H03H 9/547* (2013.01)

(58) Field of Classification Search
CPC .......... H03H 9/54–9/62; H01L 41/02–41/0825
USPC .................................................. 333/186–196
See application file for complete search history.

(56) References Cited

U.S. PATENT DOCUMENTS

| | | | | |
|---|---|---|---|---|
| 7,378,922 B2 * | 5/2008 | Kubo | ................. | B81C 1/00238 333/133 |
| 7,701,312 B2 * | 4/2010 | Park | ........................ | H03H 3/04 333/186 |
| 8,018,301 B2 * | 9/2011 | Huang | ................. | H03H 3/0072 333/186 |
| 8,261,427 B2 * | 9/2012 | Inose | ................... | H03H 9/0595 16/13 |
| 8,910,355 B2 * | 12/2014 | Adkisson | ............... | H03H 9/173 29/25.35 |
| 8,991,022 B2 * | 3/2015 | Satoh | ................... | H03H 9/1035 29/25.35 |
| 2004/0245891 A1 | 12/2004 | Kawachi et al. | | |
| 2005/0056917 A1 | 3/2005 | Kwon | | |
| 2007/0012655 A1 * | 1/2007 | Kwon | ..................... | H01L 24/11 216/13 |

FOREIGN PATENT DOCUMENTS

| | | |
|---|---|---|
| JP | 2004-364041 A | 12/2004 |
| KR | 10-0558439 B1 | 3/2006 |
| KR | 10-0836652 B1 | 6/2008 |

* cited by examiner

*Primary Examiner* — Dean Takaoka
*Assistant Examiner* — Alan Wong
(74) *Attorney, Agent, or Firm* — NSIP Law

(57) ABSTRACT

A bulk-acoustic wave filter device includes: a lower electrode layer disposed on the substrate; a bonding part disposed on the lower electrode layer, at an edge of the substrate; a ground part spaced apart from the bonding part; and a flow suppressing part disposed between the bonding part and the ground part, and offset with respect to the bonding part and the ground part.

20 Claims, 4 Drawing Sheets

A

BULK-ACOUSTIC WAVE FILTER DEVICE

CROSS-REFERENCE TO RELATED APPLICATIONS

This application claims the benefit under 35 U.S.C. § 119(a) of Korean Patent Application No. 10-2016-0108974 filed on Aug. 26, 2016, in the Korean Intellectual Property Office, the entire disclosure of which is incorporated herein by reference for all purposes.

BACKGROUND

1. Field

The present disclosure relates to a bulk-acoustic wave filter device.

2. Description of Related Art

Recently, in the field of wireless communications systems, a device using a bulk-acoustic wave (BAW) filter device has played an important role as an essential part used to achieve miniaturization, multifunctionality and high performance. Meanwhile, in order to provide desirable characteristics of the bulk-acoustic wave filter device, a hermetic seal capable of maintaining reliable sealing in a vacuum state to block the permeation of moisture and other outside elements may be required.

That is, a wafer level bonding technique has been adopted in order to maintain a hermetic seal at the time of manufacturing a bulk-acoustic wave filter device. To this end, bonding parts for hermetic sealing may be provided at edges of a substrate wafer and a cap wafer.

A bulk-acoustic wave filter device may be provided with a ground part, and the ground part may be provided on the substrate wafer to be disposed adjacent to the bonding part. However, there may be a problem in that a melted part of the bonding part may flow into the ground part when bonding the bonding part by a melting process.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a bulk-acoustic wave filter device includes: a substrate; a lower electrode layer disposed on the substrate; a bonding part disposed on the lower electrode layer, at an edge of the substrate; a ground part spaced apart from the bonding part; and a flow suppressing part disposed between the bonding part and the ground part, and offset with respect to the bonding part and the ground part.

The flow suppressing part may be vertically stepped with respect to the bonding part and the ground part.

The flow suppressing part may be thinner than the ground part and the bonding part.

The flow suppressing part may include a piezoelectric layer disposed on the lower electrode layer, between the ground part and the bonding part.

The flow suppressing part may further include a protective layer disposed on the piezoelectric layer.

The flow suppressing part may further include an upper electrode layer disposed on the piezoelectric layer.

The flow suppressing part may further include a protective layer disposed on the upper electrode layer.

The flow suppressing part may be thicker than the ground part.

The flow suppressing part may include a piezoelectric layer that is thinner than the ground part and the bonding part, and a dam layer disposed on the piezoelectric layer and protruding above the ground part.

The flow suppressing part may further include a protective layer disposed between the piezoelectric layer and the dam layer.

The flow suppressing part may further include an upper electrode layer disposed between the piezoelectric layer and the dam layer.

The flow suppressing part may further include an upper electrode layer disposed on the piezoelectric layer, and a protective layer disposed on the upper electrode layer.

The bonding part may include a base layer having a thickness that is the same as a thickness of the ground part, and a sealing layer disposed at an edge of the base layer.

The ground part and the bonding part may include any one of gold (Au), a gold-tin (Au—Sn) alloy, copper (Cu), and a copper-tin (Cu—Sn) alloy.

The dam layer may include any one of gold (Au), a gold-tin (Au—Sn) alloy, copper (Cu), and a copper-tin (Cu—Sn) alloy.

In another general aspect, a bulk-acoustic wave filter device includes: a substrate; a lower electrode layer disposed on the substrate; a bonding part including a base layer disposed on the lower electrode layer and a sealing layer disposed at an edge of the base layer; a ground part spaced apart from the bonding part; and a flow suppressing part disposed between the bonding part and the ground part, and having a thickness that is different than a thickness of the ground part.

The base layer may have a thickness that is the same as a thickness of the ground part, and the flow suppressing part may be thinner or thicker than the base layer and the ground part.

The flow suppressing part may include a piezoelectric layer disposed on the lower electrode layer and a dam layer disposed on the piezoelectric layer.

The dam layer may protrude above the ground part, and may be configured to prevent the sealing layer from flowing toward the ground part when the bonding part is melted.

The piezoelectric layer may include aluminum nitride and the dam layer may include a gold-tin (Au—Sn) alloy layer.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
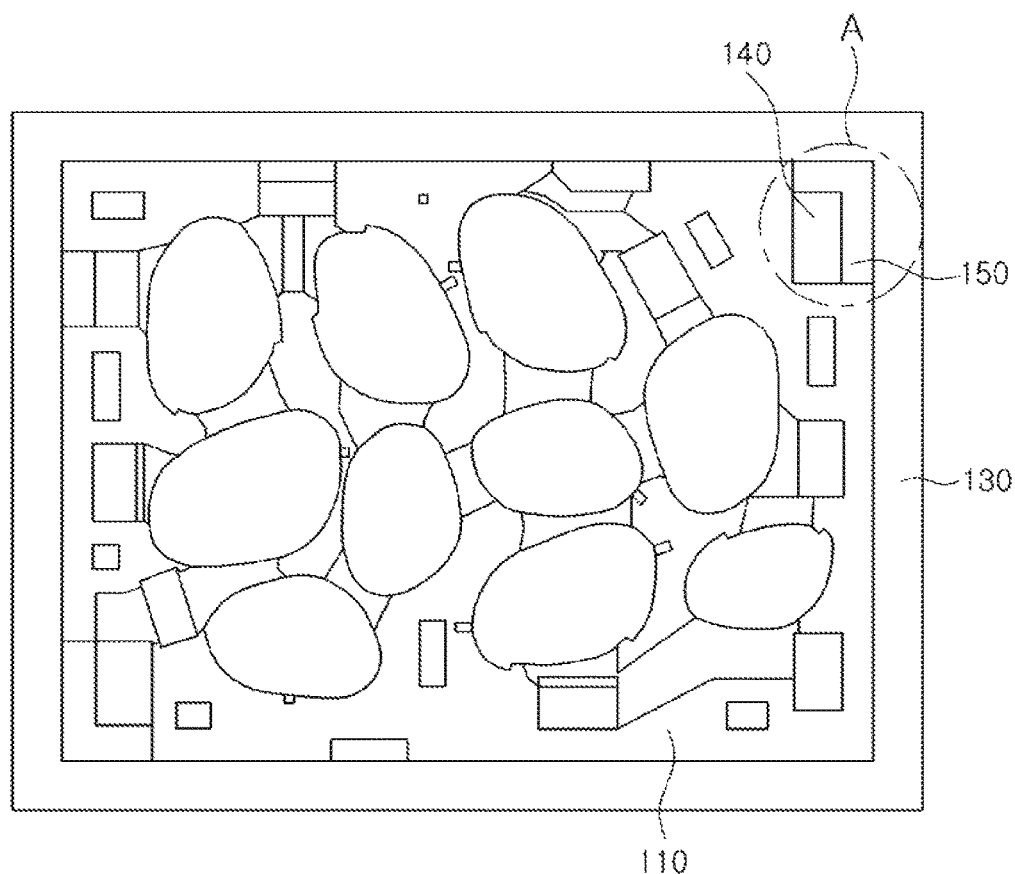
FIG. 1 is a plan view illustrating a configuration of a bulk-acoustic wave filter device, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 2:
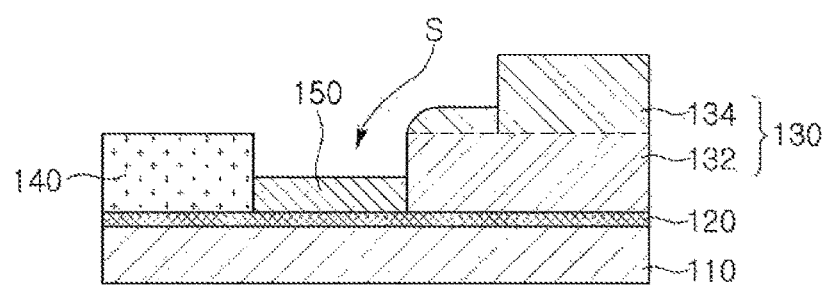
FIG. 2 is a schematic cross-sectional view of part A of FIG. 1.

FIG. 1 is a plan view illustrating a configuration of a bulk-acoustic wave filter device 100, according to an embodiment. FIG. 2 is a schematic cross-sectional view of part A of FIG. 1.

Referring to FIGS. 1 and 2, the bulk-acoustic wave filter device 100 includes a substrate 110, a lower electrode layer 120, a bonding part 130, a ground part 140, and a flow suppressing part 150.

The substrate 110 may be a substrate on which silicon is laminated. For example, a silicon wafer is used as a substrate.

The lower electrode layer 120 is formed on the substrate 110. For example, the lower electrode layer 120 is formed of a conductive material such as molybdenum (Mo), ruthenium (Ru), tungsten (W), iridium (Ir), and platinum (Pt) or alloys thereof.

In addition, the lower electrode layer 120 may be used as either an input electrode or an output electrode for applying electrical signals such as a radio frequency (RF) signal.

The bonding part 130 is formed on the lower electrode layer 120 and is disposed at an edge of the substrate 110. For example, the bonding part 130 includes a base layer 132 having a thickness corresponding to a thickness of the ground part 140 and a sealing layer 134 disposed at an edge of the base layer 132. For example, the sealing layer 134 is formed on a cap wafer (not shown) for capping and is bonded to the base layer 132 at the time of wafer level bonding of the substrate 110 and the cap wafer.

For example, the bonding part 130 is formed of a material such as gold (Au), a gold-tin (Au—Sn) alloy, copper (Cu), or a copper-tin (Cu—Sn) alloy. However, the material of the bonding part is not limited to these examples, and therefore the bonding part 130 may be formed of a material containing gold or tin. The sealing layer 134 may be formed to have a narrower width than the base layer 132.

The ground part 140 is spaced apart from the bonding part 130. The thickness of the ground part 140 may correspond to (e.g., may be about the same as) the thickness of the base layer 132 of the bonding part 130, and may be formed of the gold-tin (Au—Sn) alloy.

For example, the ground part 140 has a rectangular shape when viewed from above and is disposed adjacent to a corner of the substrate 110.

A space portion S in which the flow suppressing part 150 is disposed is formed between the ground part 140 and the bonding part 130.

The flow suppressing part 150 is disposed between the bonding part 130 and the ground part 140, and is formed to be offset or stepped with respect to the bonding part 130 and the ground part 140. For example, the flow suppressing part 150 is vertically stepped with respect to the bonding part 130 and the ground part 140. For example, the flow suppressing part 150 is formed to be thinner than the ground part 140 and the bonding part 130. That is, the flow suppressing part 150 is formed of a piezoelectric layer formed on the lower electrode layer 120, between the ground part 140 and the bonding part 130.

Further, the piezoelectric layer may be formed to be thinner than the bonding part 130 and the ground part 140 so as to prevent a part of the bonding part 130 melted by melting of the bonding part 130 from flowing into the bulk-acoustic wave filter device 100 due to the flowing of the melted part toward the ground part 140 during melting of the bonding part 130.

The piezoelectric layer of the flow suppressing part 150 converts physical vibrations into acoustic waves. Further, the piezoelectric layer may be formed by depositing aluminum nitride, doped aluminum nitride, zinc oxide, or lead zirconate titanate on the lower electrode layer 120.

As described above, the flow suppressing part 150 prevents a part of the bonding part 130 melted by melting of the bonding part 130 from flowing into the bulk-acoustic wave filter device 100 through the ground part 140.

Modified examples of part A of FIG. 1 are described below with reference to FIGS. 3 through 9.

Figure 3:
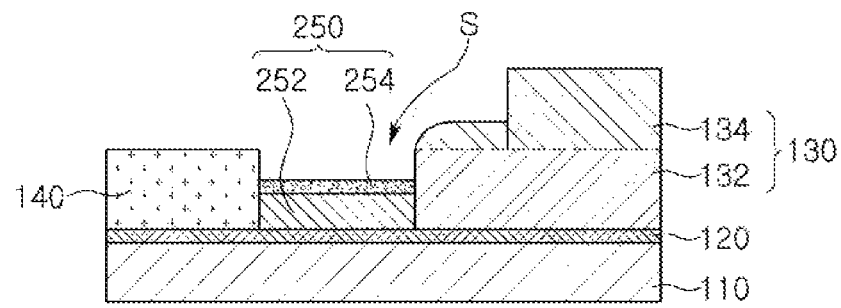
FIG. 3 is a schematic cross-sectional view of a modified example of part A of FIG. 1.

FIG. 3 is a schematic cross-sectional view of a modified example of part A of FIG. 1.

Referring to FIG. 3, a flow suppressing part 250 is disposed between the bonding part 130 and the ground part 140, and is formed to be offset or stepped with respect to the bonding part 130 and the ground part 140. For example, the flow suppressing part 250 is vertically stepped with respect to the bonding part 130 and the ground part 140. For example, the flow suppressing part 250 is formed to be thinner than the ground part 140 and the bonding part 130.

The flow suppressing part 250 is formed of a piezoelectric layer 252 disposed on the lower electrode layer 120, and a protective layer 254 disposed on the piezoelectric layer 252. The piezoelectric layer 252 and the protective layer 254 are disposed between the ground part 140 and the bonding part 130.

The flow suppressing part 250 may be formed to be thinner than the bonding part 130 and the ground part 140 so as to prevent a melted part of the bonding part 130 from flowing into the bulk-acoustic wave filter device 100 due to the flowing of the melted part toward the ground part 140 during melting of the bonding part 130.

The piezoelectric layer 252 of the flow suppressing part 250 converts physical vibrations into acoustic waves. Further, the piezoelectric layer 252 may be formed by depositing aluminum nitride, doped aluminum nitride, zinc oxide, or lead zirconate titanate on the lower electrode layer 120.

Further, the protective layer 254, which is a component for preventing breakage of the piezoelectric layer 252, may be formed of an insulating material such as silicon oxide.

As described above, the flow suppressing part 250 prevents a melted part of the bonding part 130 from flowing into the bulk-acoustic wave filter device 100 through the ground part 140 when the bonding part 130 is melted.

Figure 4:
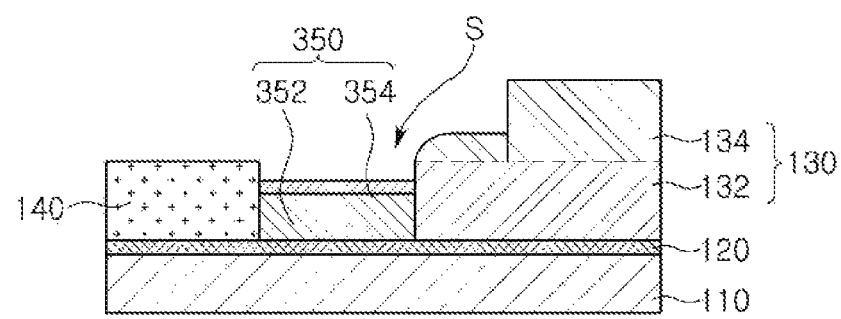
FIG. 4 is a schematic cross-sectional view of another modified example of part A of FIG. 1.

FIG. 4 is a schematic cross-sectional view of another modified example of part A of FIG. 1.

Referring to FIG. 4, a flow suppressing part 350 is disposed between the bonding part 130 and the ground part 140, and is formed to be offset or stepped with respect to the bonding part 130 and the ground part 140. For example, the flow suppressing part 350 is vertically stepped with respect to the bonding part 130 and the ground part 140. For example, the flow suppressing part 350 is formed to be thinner than the ground part 140 and the bonding part 130.

The flow suppressing part 350 is formed of a piezoelectric layer 352 disposed on the lower electrode layer 120, and an upper electrode layer 354 disposed on the piezoelectric layer 352. The piezoelectric layer 352 and the upper electrode layer 354 are disposed between the ground part 140 and the bonding part 130.

The flow suppressing part 350 is formed to be thinner than the bonding part 130 and the ground part 140 so as to prevent a melted part of the bonding part 130 from flowing into the bulk-acoustic wave filter device 100 due to the melted part flowing toward the ground part 140 during melting of the bonding part 130.

The piezoelectric layer 352 of the flow suppressing part 350 converts physical vibrations into acoustic waves. Further, the piezoelectric layer 352 may be formed by depositing aluminum nitride, doped aluminum nitride, zinc oxide, or lead zirconate titanate on the lower electrode layer 120.

For example, the upper electrode layer 354 is formed of a conductive material such as molybdenum (Mo), ruthenium (Ru), tungsten (W), iridium (Ir), platinum (Pt), or alloys thereof, and may be formed of the same material as the lower electrode layer 120.

As described above, the flow suppressing part 350 prevents a melted part of the bonding part 130 from flowing into the bulk-acoustic wave filter device 100 through the ground part 140 when the bonding part 130 is melted.

Figure 5:
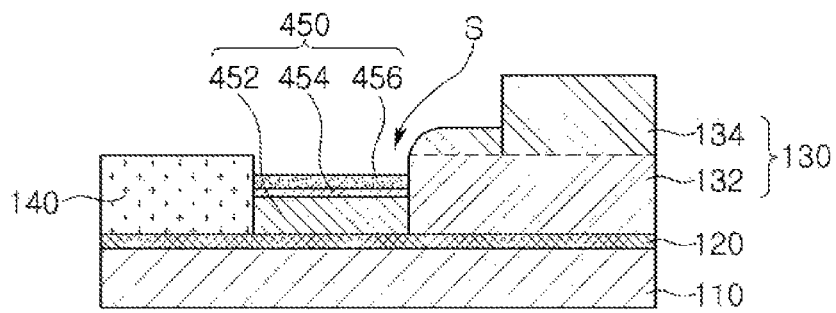
FIG. 5 is a schematic cross-sectional view of another modified example of part A of FIG. 1.

FIG. 5 is a schematic cross-sectional view of another modified example of part A of FIG. 1.

Referring to FIG. 5, a flow suppressing part 450 is disposed between the bonding part 130 and the ground part 140, and is formed to be offset or stepped with respect to the bonding part 130 and the ground part 140. For example, the flow suppressing part 450 is vertically stepped with respect to the bonding part 130 and the ground part 140. For example, the flow suppressing part is formed to be thinner than the ground part 140 and the bonding part 130.

The flow suppressing part 450 is formed of a piezoelectric layer 452 disposed on the lower electrode layer 120, an upper electrode layer 454 formed on the piezoelectric layer 452, and a protective layer 456 disposed on the upper electrode layer 454. The piezoelectric layer 452, the upper electrode layer 454, and the protective layer 456 are disposed between the ground part 140 and the bonding part 130.

The flow suppressing part 450 is formed to be thinner than the bonding part 130 and the ground part 140 so as to prevent a melted part of the bonding part 130 from flowing into the bulk-acoustic wave filter device 100 due to the flowing of the melted part toward the ground part 140 during melting of the bonding part 130.

The piezoelectric layer 452 converts physical vibrations into acoustic waves. Further, the piezoelectric layer 452 may be formed by depositing aluminum nitride, doped aluminum nitride, zinc oxide, or lead zirconate titanate on the lower electrode layer 120.

For example, the upper electrode layer 454 is formed of conductive a material such as molybdenum (Mo), ruthenium (Ru), and tungsten (W), iridium (Ir), platinum (Pt), or alloys thereof. The material of the upper electrode layer 454 may be the same as the material of the lower electrode layer 102.

Further, the protective layer 456, which is a component for preventing breakage of the upper electrode layer 454, may be formed of metal a material such as manganese (Mo), gold (Au), aluminum (Al), or copper (Cu), or may be formed of an insulating material such as silicon oxide.

As described above, the flow suppressing part 450 prevents a melted part of the bonding part 130 from flowing into the bulk-acoustic wave filter device 100 through the ground part 140 when the bonding part 130 is melted.

Figure 6:
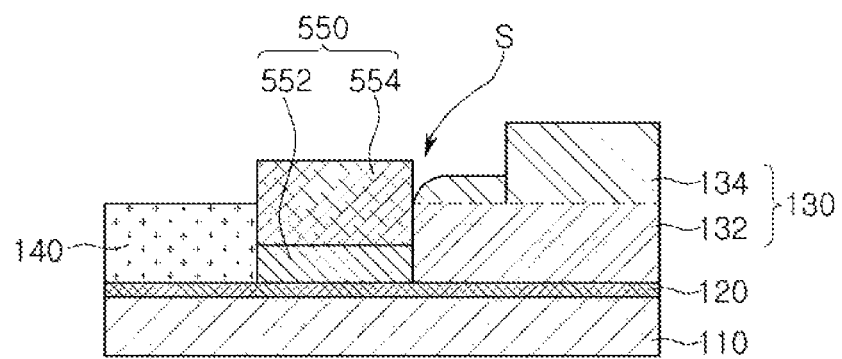
FIG. 6 is a schematic cross-sectional view of another modified example of part A of FIG. 1.

FIG. 6 is a schematic cross-sectional view of another modified example of part A of FIG. 1.

Referring to FIG. 6, a flow suppressing part 550 is disposed between the bonding part 130 and the ground part 140, and is formed to be offset or stepped with respect to the bonding part 130 and the ground part 140. For example, the flow suppressing part 550 is vertically stepped with respect to the bonding part 130 and the ground part 140. For example, the flow suppressing part 550 is formed to be thicker than the ground part 140.

The flow suppressing part 550 includes a piezoelectric layer 552 formed to be thinner than the ground part 140 and the bonding part 130, and a dam layer 554 disposed on the piezoelectric layer 552 and protruding above the ground part 140.

The piezoelectric layer 552 converts the physical vibrations into acoustic waves. Further, the piezoelectric layer 552 may be formed by depositing aluminum nitride, doped aluminum nitride, zinc oxide, or lead zirconate titanate on the lower electrode layer 120.

The dam layer 554 may be formed of a material such as gold (Au), a gold-tin (Au—Sn) alloy, copper (Cu), or a copper-tin (Cu—Sn) alloy, and may be formed of the same material as the bonding part 130 and the ground part 140. However, the material of the dam layer 554 is not limited to these examples, and therefore the dam layer 554 may be formed of a material containing gold or tin.

The dam layer 554 prevents the sealing layer 134 from flowing toward the ground part 140 when the sealing layer 134 is melted, and is disposed to protrude above the base layer 132 of the bonding part 130.

As described above, the flow suppressing part 550 prevents a part of the bonding part 130 melted by melting of the bonding part 130 from flowing into the bulk-acoustic wave filter device 100 through the ground part 140.

Figure 7:
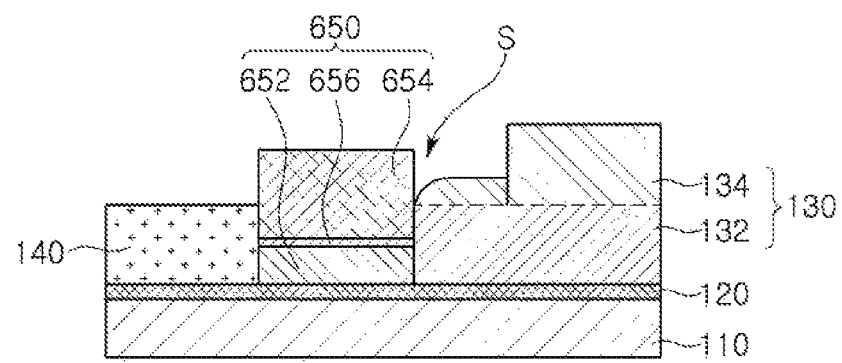
FIG. 7 is a schematic cross-sectional view of another modified example of part A of FIG. 1.

FIG. 7 is a schematic cross-sectional view of another modified example of part A of FIG. 1.

Referring to FIG. 7, a flow suppressing part 650 is disposed between the bonding part 130 and the ground part 140, and is formed to be offset or stepped with respect to the bonding part 130 and the ground part 140. For example, the flow suppressing part 650 is vertically stepped with respect to the bonding part 130 and the ground part 140. For example, the flow suppressing part 650 is formed to be thicker than the ground part 140.

The flow suppressing part 650 includes a piezoelectric layer 652 formed to be thinner than the ground part 140 and the bonding part 130, a dam layer 654 disposed on the piezoelectric layer 654 and protruding above the ground part 140, and a protective layer 656 disposed between the piezoelectric layer 652 and the dam layer 654.

The piezoelectric layer 652 converts physical vibrations into acoustic waves. Further, the piezoelectric layer 652 may be formed by depositing aluminum nitride, doped aluminum nitride, zinc oxide, or lead zirconate titanate on the lower electrode layer 120.

The dam layer 654 may be formed of a material such as gold (Au), a gold-tin (Au—Sn) alloy, copper (Cu), or a copper-tin (Cu—Sn) alloy, and may be formed of the same material as the bonding part 130 and the ground part 140. However, the material of the dam layer 654 is not limited to these examples, and therefore the dam layer 654 may be formed of a material containing gold or tin.

The dam layer 654 prevents the sealing layer 134 from flowing toward the ground part 140 when the sealing layer 134 is melted, and is disposed to protrude above the base layer 132 of the bonding part 130.

The protective layer 656, which is a component for preventing breakage of the piezoelectric layer 252, may be formed of an insulating material such as silicon oxide.

As described above, the flow suppressing part 650 prevents a part of the bonding part 130 melted by melting of the bonding part 130 from flowing into the bulk-acoustic wave filter device 100 through the ground part 140.

Figure 8:
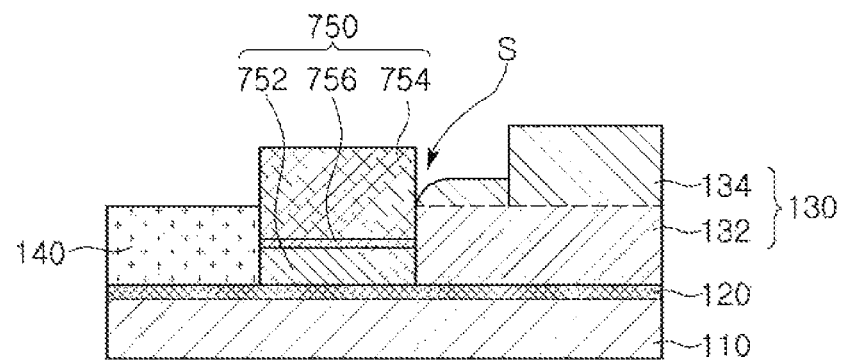
FIG. 8 is a schematic cross-sectional view of another modified example of part A of FIG. 1.

FIG. 8 is a schematic cross-sectional view of another modified example of part A of FIG. 1.

Referring to FIG. 8, a flow suppressing part 750 is disposed between the bonding part 130 and the ground part 140, and is formed to be offset or stepped with respect to the bonding part 130 and the ground part 140. For example, the flow suppressing part 750 is vertically stepped with respect to the bonding part 130 and the ground part 140. For example, the flow suppressing part 750 is formed to be thicker than the ground part 140.

The flow suppressing part 750 includes a piezoelectric layer 752 formed to be thinner than the ground part 140 and the bonding part 130, a dam layer 754 disposed on the piezoelectric layer 752 and protruding above the ground part 140, and an upper electrode layer 756 disposed between the piezoelectric layer 752 and the dam layer 756.

The piezoelectric layer 752 converts physical vibrations into acoustic waves. Further, the piezoelectric layer 752 may be formed by depositing aluminum nitride, doped aluminum nitride, zinc oxide, or lead zirconate titanate on the lower electrode layer 120.

The dam layer 754 may be formed of a material such as gold (Au), a gold-tin (Au—Sn) alloy, copper (Cu), and a copper-tin (Cu—Sn) alloy, and may be formed of the same material as the bonding part 130 and the ground part 140. However, the material of the dam layer 754 is not limited to these examples, and therefore the dam layer 754 may be formed of a material containing gold or tin.

The dam layer 754 prevents the sealing layer 134 from flowing toward the ground part 140 when the sealing layer 134 is melted, and is disposed to protrude above the base layer 132 of the bonding part 130.

For example, the upper electrode layer 756 may be formed of a conductive material such as molybdenum (Mo), ruthenium (Ru), tungsten (W), iridium (Ir), platinum (Pt), or alloys thereof. The upper electrode layer 756 may be formed of the same material as the lower electrode layer 120.

As described above, the flow suppressing part 750 prevents a part of the bonding part 130 melted by melting of the bonding part 130 from flowing into the bulk-acoustic wave filter device 100 through the ground part 140.

Figure 9:
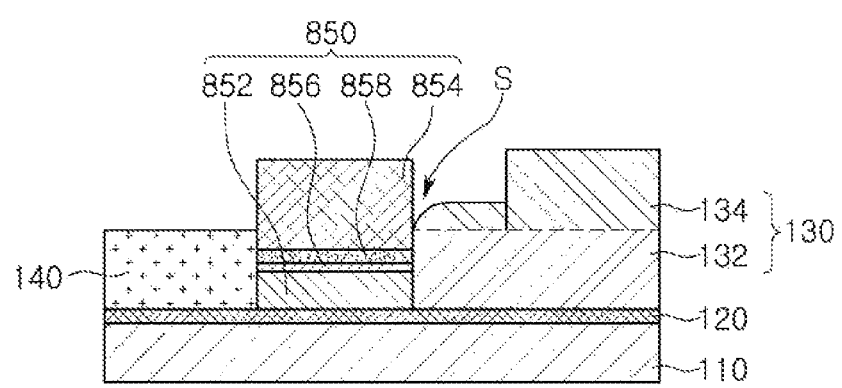
FIG. 9 is a schematic cross-sectional view of another modified example of part A of FIG. 1.

FIG. 9 is a schematic cross-sectional view of another modified example of part A of FIG. 1.

Referring to FIG. 9, a flow suppressing part 850 is disposed between the bonding part 130 and the ground part 140, and is formed to be offset or stepped with respect to the bonding part 130 and the ground part 140. For example, the flow suppressing part 850 is vertically stepped with respect to the bonding part 130 and the ground part 140. For example, the flow suppressing part 850 is formed to be thicker than the ground part 140.

The flow suppressing part 850 includes a piezoelectric layer 852 formed to be thinner than the ground part 140 and the bonding part 130, a dam layer 854 disposed on the piezoelectric layer 852 and protruding above the ground part 140, an upper electrode layer 856 disposed between the piezoelectric layer 852 and the dam layer 854, and a protective layer 858 disposed between the upper electrode layer 856 and the dam layer 854.

The piezoelectric layer 852 converts physical vibrations into acoustic waves. Further, the piezoelectric layer 852 may be formed by depositing aluminum nitride, doped aluminum nitride, zinc oxide, or lead zirconate titanate on the lower electrode layer 120.

The dam layer 854 may be formed of a material such as gold (Au), a gold-tin (Au—Sn) alloy, copper (Cu), or a copper-tin (Cu—Sn) alloy, and may be formed of the same material as the bonding part 130 and the ground part 140. However, the material of the dam layer 854 is not limited to these examples, and therefore the dam layer 854 may be formed of a material containing gold or tin.

The dam layer 854 prevents the sealing layer 134 from flowing toward the ground part 140 when the sealing layer 134 is melted, and is disposed to protrude above the base layer 132 of the bonding part 130.

For example, the upper electrode layer 856 is formed of conductive materials such as molybdenum (Mo), ruthenium (Ru), tungsten (W), iridium (Ir), and platinum (Pt), or alloys thereof, and may be formed of the same material as the lower electrode layer 120.

The protective layer 858, which is a component for preventing breakage of the upper electrode layer 856, may be formed of a metal material such as manganese (Mo), gold (Au), aluminum (Al), or copper (Cu), or an insulating material such as silicon oxide.

As described above, the flow suppressing part 850 prevents a part of the bonding part 130 melted by melting of the bonding part 130 from flowing into the bulk-acoustic wave filter device 100 through the ground part 140.

As set forth above, according to the embodiments disclosed herein, it is possible to suppress a part of the bonding part melted by melting of the bonding part during the bonding of the substrate and the cap from flowing into the ground part.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bulk-acoustic wave filter device, comprising:
   a substrate;
   a lower electrode layer disposed on the substrate;
   a bonding part disposed on the lower electrode layer, at an edge of the substrate;
   a ground part spaced apart from the bonding part; and
   a flow suppressing part disposed between the bonding part and the ground part, and offset with respect to the bonding part and the ground part.

2. The bulk-acoustic wave filter device of claim 1, wherein the flow suppressing part is vertically stepped with respect to the bonding part and the ground part.

3. The bulk-acoustic wave filter device of claim 1, wherein the flow suppressing part is thinner than the ground part and the bonding part.

4. The bulk-acoustic wave filter device of claim 3, wherein the flow suppressing part comprises a piezoelectric layer disposed on the lower electrode layer, between the ground part and the bonding part.

5. The bulk-acoustic wave filter device of claim 4, wherein the flow suppressing part further comprises a protective layer disposed on the piezoelectric layer.

6. The bulk-acoustic wave filter device of claim 4, wherein the flow suppressing part further comprises an upper electrode layer disposed on the piezoelectric layer.

7. The bulk-acoustic wave filter device of claim 6, wherein the flow suppressing part further comprises a protective layer disposed on the upper electrode layer.

8. The bulk-acoustic wave filter device of claim 1, wherein the flow suppressing part is thicker than the ground part.

9. The bulk-acoustic wave filter device of claim 8, wherein the flow suppressing part comprises a piezoelectric layer that is be thinner than the ground part and the bonding part, and a dam layer disposed on the piezoelectric layer and protruding above the ground part.

10. The bulk-acoustic wave filter device of claim 9, wherein the flow suppressing part further comprises a protective layer disposed between the piezoelectric layer and the dam layer.

11. The bulk-acoustic wave filter device of claim 9, wherein the flow suppressing part further comprises an upper electrode layer disposed between the piezoelectric layer and the dam layer.

12. The bulk-acoustic wave filter device of claim 9, wherein the flow suppressing part further comprises an upper electrode layer disposed on the piezoelectric layer, and a protective layer disposed on the upper electrode layer.

13. The bulk-acoustic wave filter device of claim 1, wherein the bonding part comprises a base layer having a thickness that is the same as a thickness of the ground part, and a sealing layer disposed at an edge of the base layer.

14. The bulk-acoustic wave filter device of claim 1, wherein the ground part and the bonding part are comprise any one of gold (Au), a gold-tin (Au—Sn) alloy, copper (Cu), and a copper-tin (Cu—Sn) alloy.

15. The bulk-acoustic wave filter device of claim 9, wherein the dam layer comprises any one of gold (Au), a gold-tin (Au—Sn) alloy, copper (Cu), and a copper-tin (Cu—Sn) alloy.

16. A bulk-acoustic wave filter device, comprising:
   a substrate;
   a lower electrode layer disposed on the substrate;
   a bonding part comprising a base layer disposed on the lower electrode layer and a sealing layer disposed at an edge of the base layer;

a ground part spaced apart from the bonding part; and a flow suppressing part disposed between the bonding part and the ground part, and having a thickness that is different than a thickness of the ground part.

17. The bulk-acoustic wave filter device of claim 16, wherein the base layer has a thickness that is the same as the thickness of the ground part, and the flow suppressing part is thinner or thicker than the base layer and the ground part.

18. The bulk-acoustic wave filter device of claim 16, wherein the flow suppressing part comprises a piezoelectric layer disposed on the lower electrode layer, and a dam layer disposed on the piezoelectric layer and protruding above the ground part.

19. The bulk-acoustic wave filter device of claim 18, wherein the dam layer is configured to prevent the sealing layer from flowing toward the ground part when the bonding part is melted.

20. The bulk acoustic wave filter device of claim 18, wherein the piezoelectric layer comprises aluminum nitride, and the dam layer comprises a gold-tin (Au—Sn) alloy.

* * * * *